US008378855B2

(12) United States Patent
Lu et al.

(10) Patent No.: US 8,378,855 B2
(45) Date of Patent: Feb. 19, 2013

(54) CONTROL DEVICE

(75) Inventors: Jiun-Nan Lu, Taipei Hsien (TW); Chih-Hsiang Tsai, Taipei Hsien (TW); Sheng-Han Yang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 744 days.

(21) Appl. No.: 12/463,370

(22) Filed: May 8, 2009

(65) Prior Publication Data

US 2010/0109916 A1 May 6, 2010

(30) Foreign Application Priority Data

Oct. 30, 2008 (CN) .......................... 2008 1 0305292

(51) Int. Cl.
*H03M 11/00* (2006.01)
*H01H 67/26* (2006.01)
*H04N 5/225* (2006.01)
*G03B 7/26* (2006.01)

(52) U.S. Cl. ..................... 341/20; 348/207.99; 348/372; 200/179; 200/410; 396/277; 396/278

(58) Field of Classification Search ............. 348/207.99, 348/372–376; 200/179, 19.03, 19.18, 36, 200/48 A, 50.34, 41, 529; 396/277, 278; 341/20–35
See application file for complete search history.

(56) References Cited

U.S. PATENT DOCUMENTS

| | | | | |
|---|---|---|---|---|
| 4,196,324 | A * | 4/1980 | Kojima et al. | 200/11 DA |
| 5,571,999 | A * | 11/1996 | Harris | 200/565 |
| 5,739,775 | A * | 4/1998 | Brandestini | 341/10 |
| 6,292,631 | B1 * | 9/2001 | Tanaka et al. | 396/280 |
| 6,927,351 | B2 * | 8/2005 | Ashton | 200/293 |

FOREIGN PATENT DOCUMENTS

| | | | |
|---|---|---|---|
| CN | 2096813 | U | 2/1992 |
| CN | 1584726 | A | 2/2005 |

* cited by examiner

*Primary Examiner* — Hai Phan
*Assistant Examiner* — Franklin Balseca
(74) *Attorney, Agent, or Firm* — Altis Law Group, Inc.

(57) ABSTRACT

A control device includes a sensor, an analysis unit, and a control unit. The sensor includes a stationary member and a rotatable member. The stationary member includes a first electrode and at least two second electrodes. The rotatable member includes a third electrode and a fourth electrode. The first electrode electrically contacts the third electrode and each second electrode electrically contacts the fourth electrode in sequence when the stationary member is rotated. The analysis unit is configured for determining which second electrode electrically contacts the fourth electrode. The control unit is configured for executing a corresponding command based upon the determination of the analysis unit.

20 Claims, 6 Drawing Sheets

CONTROL DEVICE

BACKGROUND

1. Technical Field

The present disclosure relates to control devices and, particularly, to a control device used in an electrical device.

2. Description of Related Art

Hall sensors are frequently used to detect rotation in camera control. However, the detection precision of Hall sensors may not adequately meet the specific device requirements. In addition, to avoid interference between the Hall sensor and the camera with electromagnetic fields, complicated arrangements are required, such that cost and device size are substantially and undesirably increased.

Therefore, what is called for is a control device applicable in a digital camera which can overcome the described limitations.

DETAILED DESCRIPTION

Figure 1:
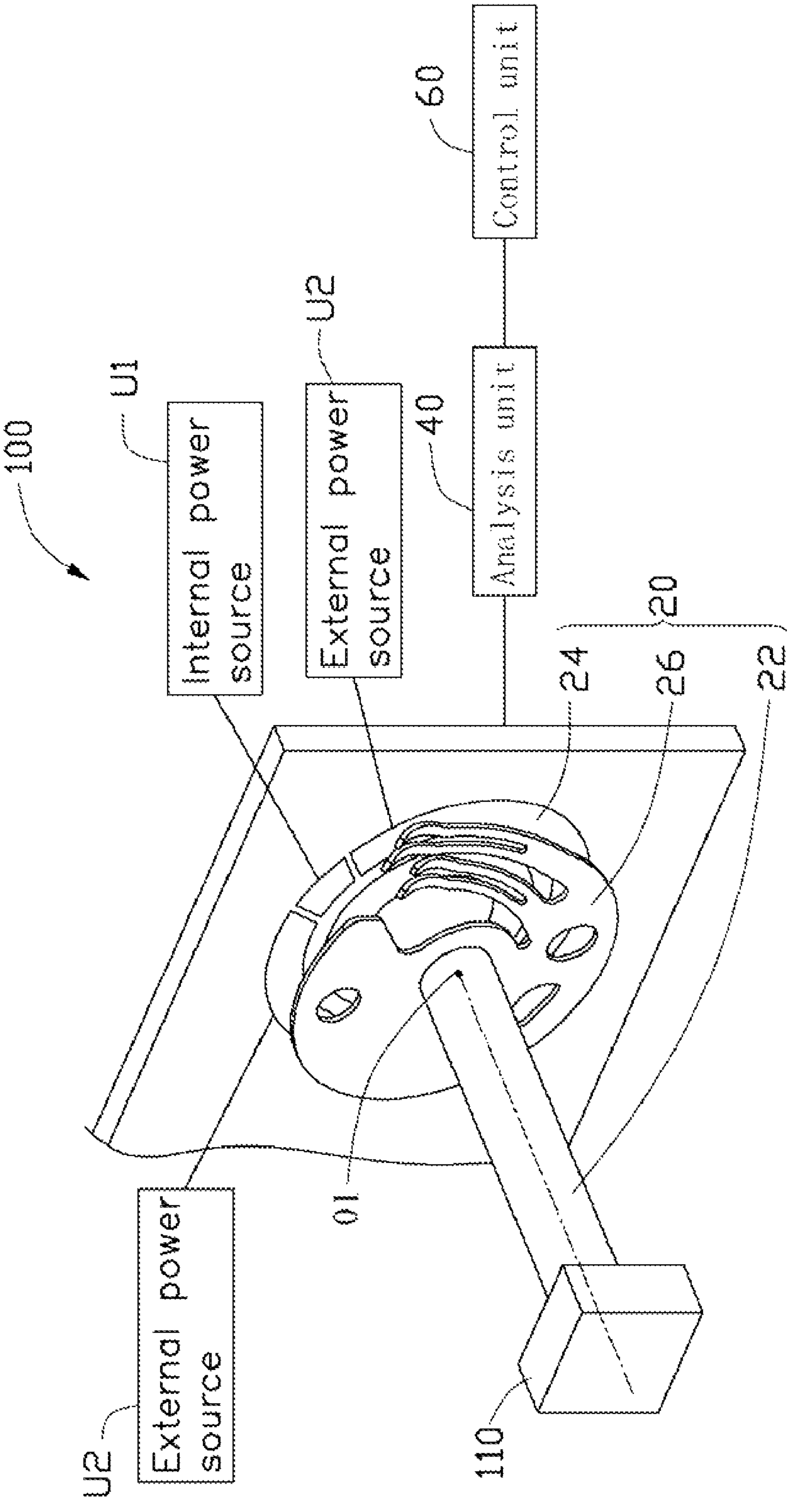
FIG. 1 is a schematic view of a first embodiment of a control device including an internal power source, a stationary member and a rotatable member.
Figure 2:
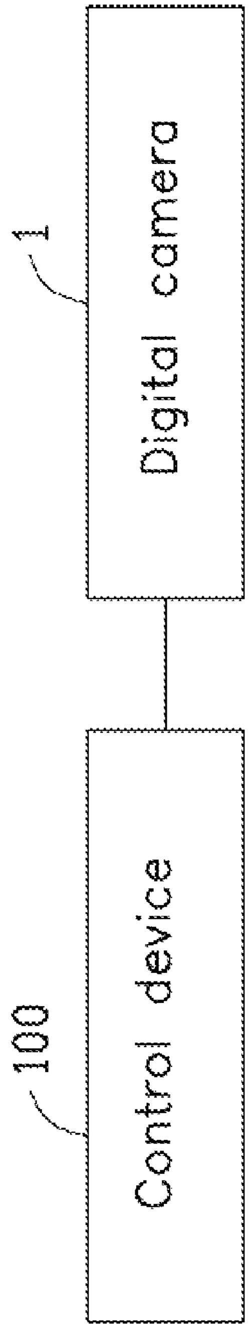
FIG. 2 illustrates a connection between the control device of FIG. 1 and a digital camera using the control device of the FIG. 1.

Referring to 1-5, a first embodiment of a control device 100 includes a sensor 20, an analysis unit 40, and a control unit 60.

The sensor 20 includes a shaft 22, a stationary member 24, and a rotatable member 26. The shaft 22 is configured for connecting an object 110, rotation of which is to be detected, to the rotatable member 26. Accordingly, the rotatable member 26 can be rotated by the object 110 via the shaft 22 about a rotating center 01 thereof.

Figure 3:
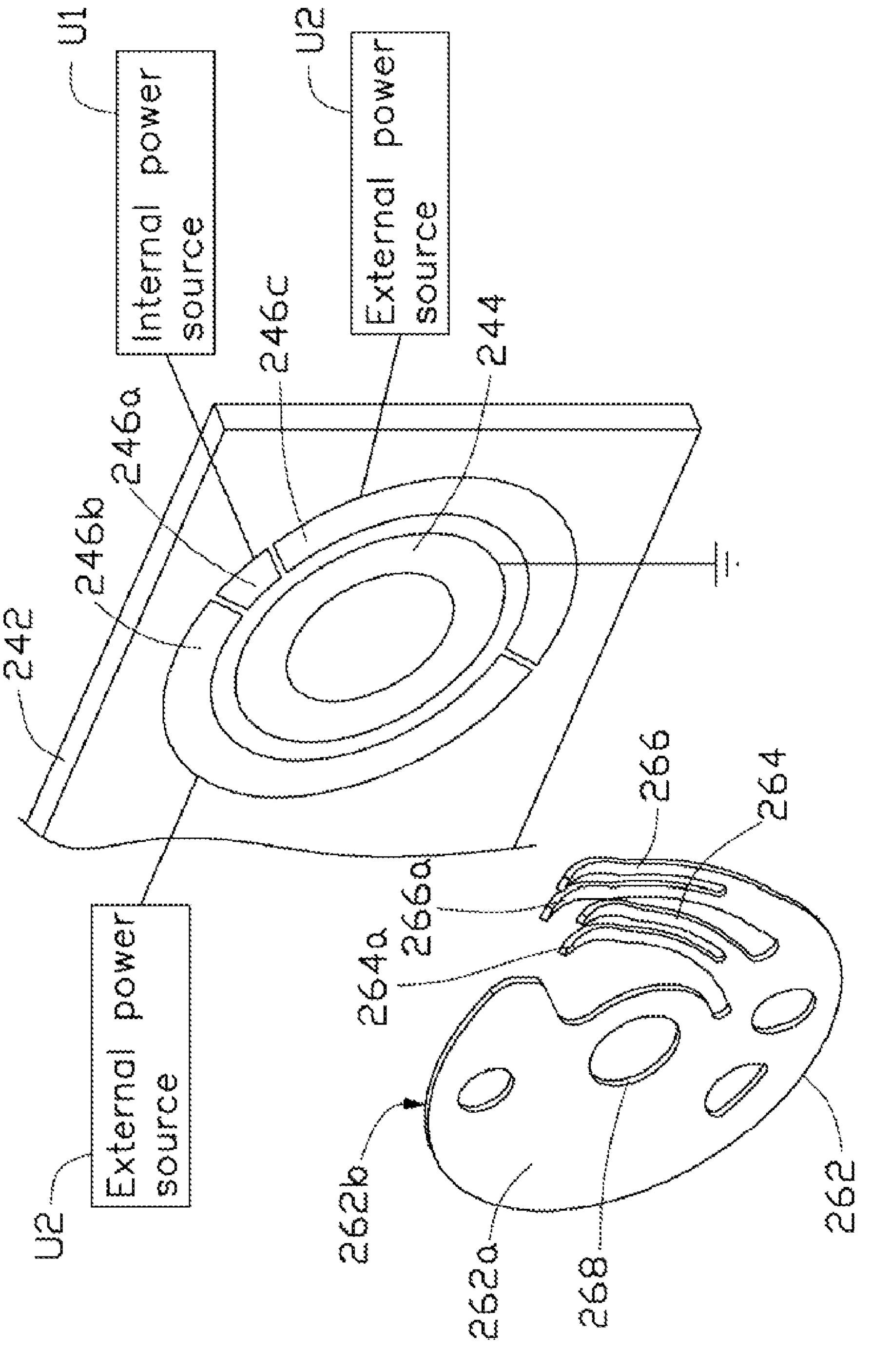
FIG. 3 is a schematic view of the stationary member and the rotatable member of the control device of FIG. 1.

Here, the control device 100 is used in a digital camera 1 (shown in FIG. 3), wherein the object 110 is a rotatable lens of the digital camera 1, and the stationary member 24 is a circuit board of the digital camera 1. The control device 100 is used to turn on and off the digital camera 1. It is to be noted, however, that the disclosure is not limited thereto.

The stationary member 24 includes a first main body 242, a first electrode 244 and three second electrodes 246*a*, 246*b*, 246*c*. The first electrode 244 and the second electrodes 246*a*, 246*b* and 246*c* are disposed on the first main body 242. Here, the first electrode 244 is an annular conductive sheet formed on the first main body 242. The three second electrodes 246*a*, 246*b*, 246*c* are also conductive sheets formed on the first main body 242 as three discontinuous sectors of an annulus, concentric about the first electrode 244. The external diameter of the first electrode 244 is less than the inner diameter of the annulus wherein the second electrodes 246*a*, 246*b* and 246*c* are located.

Figure 4:
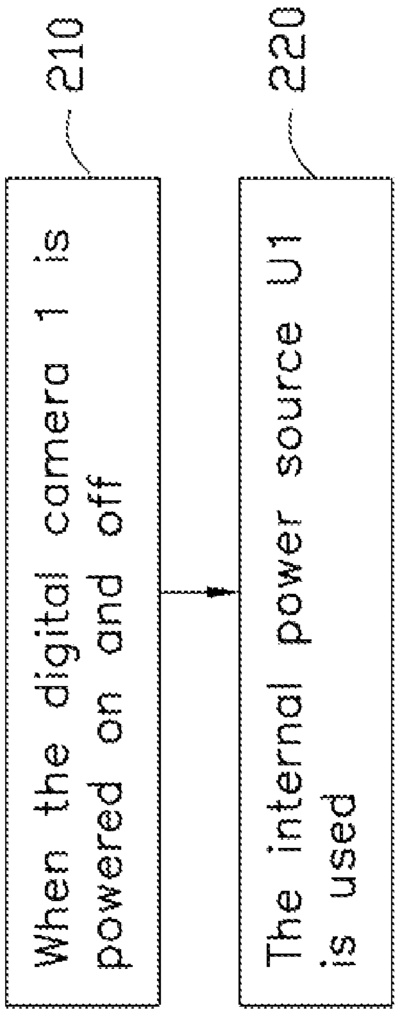
FIG. 4 is a flowchart showing the step of when the internal power source of the control device of the FIG. 1 is used.
Figure 5:
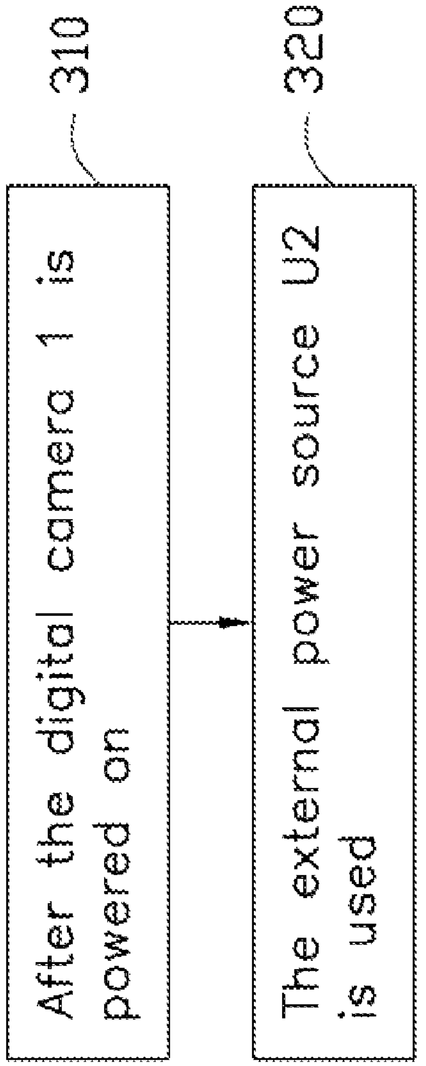
FIG. 5 is a flowchart showing the step of when an external power source is used for the control device of the FIG. 1.

The first electrode 244 is pulled down to a low voltage, such as, here, ground. Each of the second electrodes 246*a*, 246*b* and 246*c* are pulled up to corresponding high voltages. Here, the control device 100 further includes an internal power source U1, and can be connected to an external power source U2. The internal power source U1 is configured for pulling the second electrode 246*a* up to a first high voltage. The external power source U2 is configured for pulling the second electrodes 246*b* and 246*c* to a second high voltage. The external power source U2 can be the main power source of the digital camera 1. Thus, the internal power source U1 can operate before the digital camera 1 is powered on. That is, when the digital camera 1 is powered on and powered off (step 210, shown in FIG. 4), the internal power source U1 is used (step 220, shown in FIG. 4). The external power source U2 can operate after the digital camera 1 has been powered on. In other words, only after the digital camera 1 is powered on (step 310, shown in FIG. 5), the external power source U2 is used (step 320, shown in FIG. 5).

The radians of the second electrodes 246*a*, 246*b*, 246*c* can be determined by manufacturers. Here, the radian of the second electrode 246*a* is substantially 0-0.44 radians, the radian of the second electrode 246*b* is substantially 0.52-3.93 radians, and the radian of the second electrode 246*c* is substantially 4.01-5.84 radians.

It should be mentioned that although three second electrodes 246*a*, 246*b*, 246*c* are disclosed, more second electrodes or fewer may be optionally adopted in the disclosed device while remaining well within the scope thereof. Further, the arrangement/layout of the second electrodes is not limited to that disclosed here.

The rotatable member 26 includes a second main body 262, a third electrode 264, and a fourth electrode 266. The rotating center 01 is defined on the second main body 262. Here, the second main body 262 is substantially fan-shaped. The second main body 262 includes a first surface 262*a* and an opposite second surface 262*b*. The third and fourth electrodes 264, 266 spiral from an end of the second main body 262 toward the other end of the second main body 262. The distal ends of the third and fourth electrodes 264 and 266 are bent from the second surface 262*b* to the first surface 262*a* to form two contact portions 264*a*, 266*a*. The distance between the contact portion 264*a* and the rotating center 01 is substantially equal to the median radius of the first electrode 244. The distance between the second contact portion 266*a* and the rotating center 01 of the second main body 262 is substantially equal to the median radius of the annulus where the second electrodes 246*a*, 246*b* and 246*c* are located. In addition, the third and fourth electrodes 264 and 266 are made of a material having elasticity, such as metal. As a result, when the rotatable member 26 is aligned with and disposed on the stationary member 24 and rotated around the rotating center 01, the third electrode 264 keeps contact with the first electrode 244, and the fourth electrode 266 contacts each of the three second electrodes 246*a*, 246*b*, 246*c* in sequence.

Here, the second main body 262 defines a through hole 268 aligned with the rotating center 01, into which the shaft 22 tightly fits. When the object 110 is rotated, the shaft 22 transmits the rotation to the rotatable member 26.

The analysis unit 40 is configured for determining which of the second electrodes 246*a*, 246*b*, 246*c* electrically contacts the fourth electrode 266. In detail, as mentioned, when the second electrodes 246*a*, 246*b* and 246*c* do not contact the fourth electrode 266, they are all pulled up to corresponding high voltages. Once one of the second electrodes 246*a*, 246*b* and 246*c* contacts the fourth electrode 266, the voltage thereof will go to low voltage, such as to ground. Accordingly, the analysis unit 40 can determine which second electrode contacts the fourth electrode 266 by detecting the voltage of the three second electrodes. For example, if the second electrode 246*a* is detected at low voltage, the analysis unit 40 determines that the second electrode 246*a* contacts the fourth electrode 266. The angle of the object 110 is substantially 0-0.44 radians.

The control unit 60 is configured for executing a corresponding command based upon the determination of the analysis unit 40. Associations between camera commands and corresponding angle ranges of the object 110 (the connections of the fourth electrode 266 and corresponding second electrodes) are stored in the control unit 60. Here, powering on corresponds to the second electrode 246*a* contacting the fourth electrode 266, display of a positive orientation picture corresponds the second electrode 246*b* contacting the fourth electrode 266, and display of a reverse orientation picture corresponds to the second electrode 246*c* contacting the fourth electrode 266.

When the fourth electrode 266 contacts the second electrode 246*a*, the rotated angle of the object 110 is substantially of 0-0.44 radians, and the digital camera 1 is not been powered on. When the fourth electrode 266 contacts the electrode 246*b*, the rotated angle of the object 110 is substantially 0.52-3.93 radians, the control unit 60 powers the digital camera 1 on, and allows a positive orientation picture to be displayed. When the fourth electrode 266 contacts with the second electrode 246*c*, the rotated angle of the object 110 is substantially 4.01-5.84 radians, the control unit 60 directs the digital camera 1 to display a reverse orientation picture.

Figure 6:
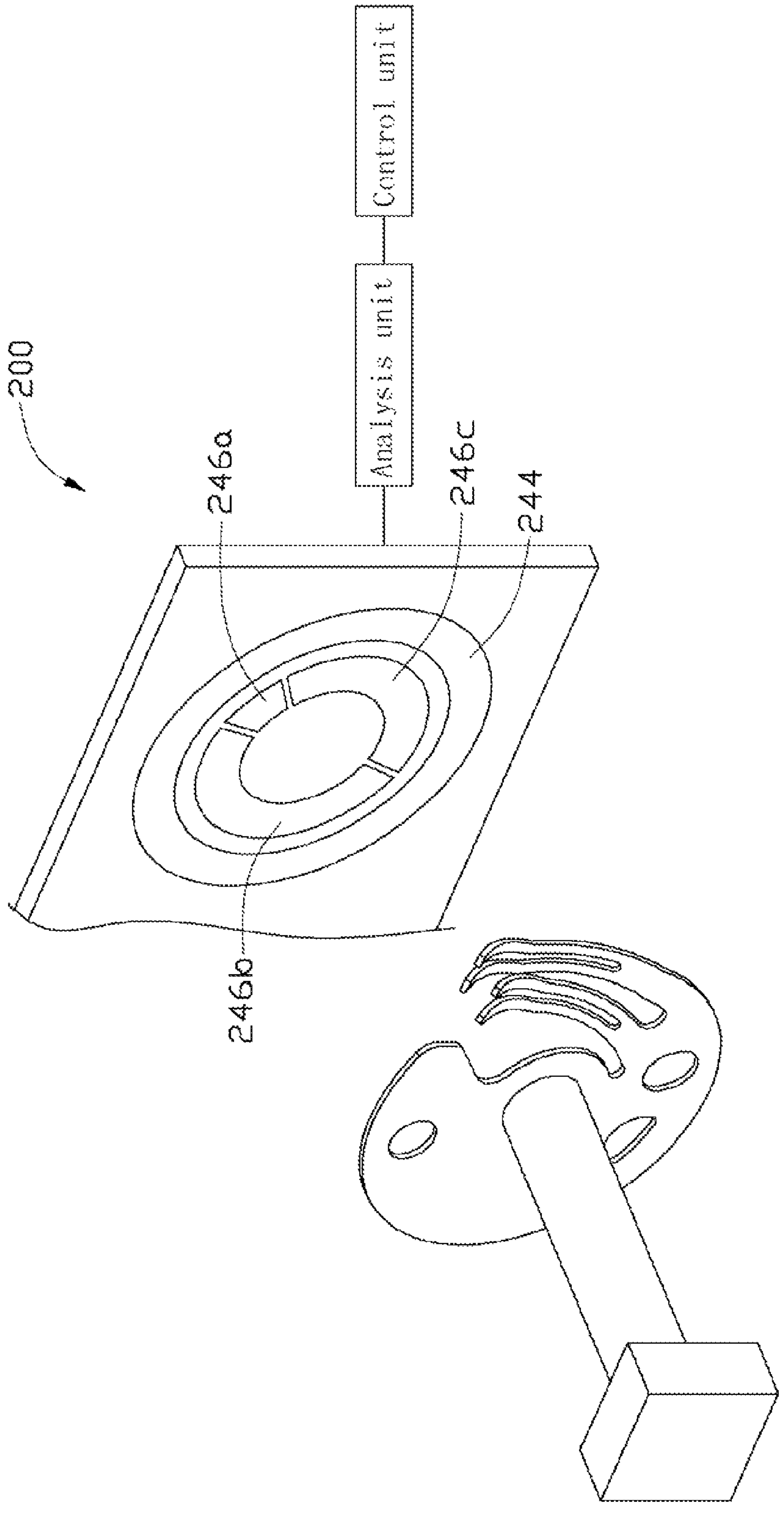
FIG. 6 is a schematic view of a second embodiment of a control device.

FIG. 6 shows a second embodiment of a control device 200 differing from the control device 100 of the first embodiment only in that the external diameter of the second electrodes 246*a*, 246*b* and 246*c* is less than the inner diameter of the first electrode 244.

The control device can execute different commands based upon which second electrode electrically contacts the fourth electrode, allowing the control device to not only conserve space and cost, but also provide accurate detection.

It is to be understood, however, that even though numerous characteristics and advantages of the embodiments have been set forth in the foregoing description, together with details of the structures and functions of the embodiments, the disclosure is illustrative only, and changes may be made in detail, especially in matters of arrangement of parts within the principles of the invention to the full extent indicated by the broad general meaning of the terms in which the appended claims are expressed.

What is claimed is:

1. A control device used in a digital camera, comprising:

an internal power source;

a sensor comprising a stationary member and a rotatable member, the stationary member comprising a first electrode and at least two second electrodes, the rotatable member comprising a third electrode and a fourth electrode, the first electrode electrically contacting the third electrode, wherein each one of the at least two second electrodes electrically contacts the fourth electrode in sequence when the rotatable member is rotated;

a shaft connecting to the rotatable member, an analysis unit configured for determining which one of the at least two second electrodes electrically contacts the fourth electrode;

a control unit;

wherein the control unit powers off the camera whenever the third electrode is electrically contacting the first electrode which is grounded and the fourth electrode is electrically contacting the second electrode of the at least two second electrodes that is electrically connected to the internal power which operates whenever the digital camera is powered off and powered on, the control unit powers the camera on whenever the third electrode is electrically contacting the first electrode which is grounded and the fourth electrode is electrically contacting the other one of the at least two second electrodes that is electrically connected to an external power which operates only after the digital camera is powered on, the control unit detects rotation angle of an object of the digital camera connecting to the rotatable member via the shaft according to the determination of the analysis unit.

2. The control device of claim 1, wherein the stationary member further comprises a first main body, the first and second electrodes are formed on the first main body.

3. The control device of claim 2, wherein the rotatable member further comprises a second main body, the third and fourth electrodes spiraling from an end of the second main body toward the other end of the second main body.

4. The control device of claim 3, wherein the second main body is substantially fan-shaped.

5. The control device of claim 4, wherein the second main body of the rotatable member defines a rotating center and a through hole aligned therewith, into which the shaft is fitted.

6. The control device of claim 5, wherein the second main body comprises a first surface and an opposite second surface, the second surface is closer to the stationary member compared to the first surface, the distal end of the third electrode is bent from the first surface to the second surface to form a first contact portion, the distance between the first contact portion and the rotating center of the second main body being substantially equal to the median radius of the first electrode.

7. The control device of claim 5, wherein the second main body comprises a first surface and an opposite second surface, the second surface is closer to the stationary member compared to the first surface the distal end of the fourth electrode is bent from the first surface to the second surface to form a second contact portion, the distance between the second contact portion and the rotating center of the second main body being substantially equal to the median radius of the annulus where the second electrodes are located.

8. The control device of claim 1, wherein the first electrode is an annular conductive sheet.

9. The control device of claim 8, wherein the at least two second electrodes comprises three second electrodes being conductive sheets, and three discontinuous sectors of an annulus that is concentric about the first electrode.

10. The control device of claim 9, wherein the radians of the three second electrodes are substantially 0-0.44 radians, 0.52-3.93 radians, and 4.01-5.84 radians respectively.

11. The control device of claim 9, wherein the external diameter of the first electrode is less than the inner diameter of the annulus where the three second electrodes are located.

12. The control device of claim 9, wherein the external diameter of the annulus where the three second electrodes are located is less than the inner diameter of the first electrode.

13. The control device of claim 1, wherein once the fourth electrode is disconnected to the second electrode which is connected to the internal power, the voltage applied to the second electrode which is connected to the internal power becomes a high voltage from a low voltage, the control device turns the digital camera on and starts up the external power according to the high voltage.

14. A control device used in an electronic device, comprising:

an internal power source; and a sensor comprising a stationary member and a rotatable member, the stationary member comprising a first electrode and two second electrodes, the rotatable member comprising a third electrode and a fourth electrode, the first electrode electrically contacting the third electrode, wherein each one of the two second electrodes electrically contacts the fourth electrode in sequence when the rotatable member is rotated; and wherein the control device powers off the electronic device whenever the third electrode is electrically contacting the first electrode which is grounded and the fourth electrode is electrically contacting the second electrode of the two second electrodes that is electrically connected to the internal power which operates whenever the electronic device is powered off and powered on, the control unit powers the electronic device on whenever the third electrode is electrically contacting the first electrode which is grounded and the fourth electrode is electrically contacting the other one of the two second electrodes that is electrically connected to an external power which operates after the electronic device is powered on.

15. The control device of claim 14, wherein the first electrode is an annular conductive sheet, the two second electrodes are discontinuous sectors of an annulus that is concentric about the first electrode.

16. The control device of claim 14, wherein the stationary member further comprises a first main body, the first and second electrodes formed on the first main body.

17. The control device of claim 16, wherein the rotatable member further comprises a second main body, the third and fourth electrodes spiraling from an end of the second main body toward the other end of the second main body.

18. The control device of claim 17, wherein the sensor further comprises a shaft connected between an object of the electronic device and the second main body of the rotatable member, the sensor detects rotation angle of the object.

19. The control device of claim 18, wherein the second main body comprises a first surface and an opposite second surface, the second surface is closer to the stationary member compared to the first surface, the distal end of the third electrode is bent from the first surface to the second surface to form a first contact portion, the distance between the first contact portion and the rotating center of the second main body being substantially equal to the median radius of the first electrode.

20. The control device of claim 18, wherein the second main body comprises a first surface and an opposite second surface, the second surface is closer to the stationary member compared to the first surface the distal end of the fourth electrode is bent from the first surface to the second surface to form a second contact portion, the distance between the second contact portion and the rotating center of the second main body being substantially equal to the median radius of the annulus where the second electrodes are located.

* * * * *